(12) United States Patent
Ewing et al.

(10) Patent No.: US 7,702,771 B2
(45) Date of Patent: *Apr. 20, 2010

(54) ELECTRICAL POWER DISTRIBUTION DEVICE HAVING A CURRENT DISPLAY

(75) Inventors: Carrel W. Ewing, Incline Village, NV (US); Brian P. Auclair, Reno, NV (US); Andrew J. Cleveland, Reno, NV (US); James P. Maskaly, Sparks, NV (US); Dennis W. McGlumphy, Sun Valley, NV (US); Mark J. Bigler, Eugene, OR (US)

(73) Assignee: Server Technology, Inc., Reno, NV (US)

( * ) Notice: Subject to any disclaimer, the term of this patent is extended or adjusted under 35 U.S.C. 154(b) by 278 days.

This patent is subject to a terminal disclaimer.

(21) Appl. No.: 11/548,471

(22) Filed: Oct. 11, 2006

(65) Prior Publication Data

US 2007/0076340 A1    Apr. 5, 2007

Related U.S. Application Data

(63) Continuation of application No. 11/243,701, filed on Oct. 4, 2005, which is a continuation of application No. 09/930,780, filed on Aug. 15, 2001, now Pat. No. 7,043,543, which is a continuation-in-part of application No. 09/732,557, filed on Dec. 8, 2000, now Pat. No. 7,099,934, which is a continuation-in-part of application No. 09/375,471, filed on Aug. 16, 1999, now Pat. No. 6,711,613, which is a continuation-in-part of application No. 08/685,436, filed on Jul. 23, 1996, now Pat. No. 5,949,974.

(51) Int. Cl.
  *G06F 15/173*  (2006.01)
  *H02B 1/00*    (2006.01)
  *H02B 5/00*    (2006.01)

(52) U.S. Cl. .................. 709/223; 361/601; 361/602; 361/624; 361/626; 361/627; 361/641; 307/11; 307/18; 307/31; 307/32; 307/36; 307/37; 307/43

(58) Field of Classification Search ................. None
See application file for complete search history.

(56) References Cited

U.S. PATENT DOCUMENTS 4,638,175 A    1/1987    Bradford et al.

(Continued)

OTHER PUBLICATIONS

"TPC 4000/MTD: World's First 1U, 3Ø, 16A or 32A Distribution Unit," Pulizzi Engineering Inc., 2 pp. (1999).

(Continued)

*Primary Examiner*—Ashok B Patel
(74) *Attorney, Agent, or Firm*—Holland & Hart LLP

(57) ABSTRACT

An electrical power distribution unit can include a power distribution unit enclosure, a power input associated with the power distribution unit enclosure, and a plurality of power outputs associated with the power distribution unit enclosure. At least certain power outputs can be connectable to one or more electrical loads external to the power distribution unit enclosure and to the power input. In some embodiments, an intelligent power section can communicate with at least one of the power outputs and can connect to a communications network external to the power distribution unit enclosure.

23 Claims, 8 Drawing Sheets

U.S. PATENT DOCUMENTS

| | | | |
|---|---|---|---|
| 4,644,320 | A | 2/1987 | Carr et al. |
| 4,674,031 | A | 6/1987 | Siska, Jr. |
| 4,719,364 | A | 1/1988 | Pequet et al. |
| 4,769,555 | A | 9/1988 | Pequet et al. |
| 4,918,562 | A | 4/1990 | Pulizzi et al. |
| 5,424,903 | A | 6/1995 | Schreiber |
| 5,506,573 | A | 4/1996 | Ewing et al. |
| 5,534,734 | A | 7/1996 | Pugh et al. |
| 5,642,002 | A | 6/1997 | Mekanik et al. |
| 5,650,771 | A | 7/1997 | Lee |
| 5,736,847 | A | 4/1998 | Van Doorn et al. |
| 5,923,103 | A | 7/1999 | Pulizzi et al. |
| 5,949,974 | A | 9/1999 | Ewing et al. |
| 5,995,911 | A | 11/1999 | Hart |
| 6,008,805 | A | 12/1999 | Land et al. |
| 6,011,329 | A | 1/2000 | McGovern |
| 6,160,873 | A | 12/2000 | Truong et al. |
| 6,229,691 | B1 | 5/2001 | Tanzer et al. |
| 6,381,700 | B1 | 4/2002 | Yoshida |
| 6,388,854 | B1 | 5/2002 | Berstis et al. |
| 6,408,334 | B1 | 6/2002 | Bassman et al. |
| 6,476,729 | B1 | 11/2002 | Liu |
| 6,507,273 | B1 | 1/2003 | Chang et al. |
| 6,628,009 | B1 | 9/2003 | Chapel |
| 6,684,343 | B1 | 1/2004 | Bouchier et al. |
| 6,711,613 | B1 | 3/2004 | Ewing et al. |
| 6,741,442 | B1 | 5/2004 | McNally et al. |
| 6,826,036 | B2 | 11/2004 | Pereira |
| 6,968,465 | B2 | 11/2005 | Freevol et al. |
| 7,010,589 | B2 | 3/2006 | Ewing et al. |
| 7,043,543 | B2 | 5/2006 | Ewing et al. |
| 7,099,934 | B1 | 8/2006 | Ewing et al. |
| 7,119,676 | B1 | 10/2006 | Silverstrim et al. |
| 7,141,891 | B2 | 11/2006 | McNally et al. |
| 7,162,521 | B2 | 1/2007 | Ewing et al. |
| 7,171,461 | B2 | 1/2007 | Ewing et al. |
| 7,349,956 | B2 | 3/2008 | Anderson et al. |
| 2002/0004913 | A1 | 1/2002 | Fung |
| 2002/0120676 | A1 | 8/2002 | Biondi et al. |
| 2005/0203987 | A1 | 9/2005 | Ewing et al. |
| 2005/0223090 | A1 | 10/2005 | Ewing et al. |
| 2006/0031453 | A1 | 2/2006 | Ewing et al. |
| 2006/0031454 | A1 | 2/2006 | Ewing et al. |
| 2006/0072531 | A1 | 4/2006 | Ewing et al. |
| 2006/0186739 | A1 | 8/2006 | Grolnic et al. |
| 2006/0259538 | A1 | 11/2006 | Maskaly et al. |
| 2007/0016664 | A1 | 1/2007 | Ewing et al. |
| 2007/0050443 | A1 | 3/2007 | Maskaly et al. |
| 2007/0130243 | A1 | 6/2007 | Ewing et al. |
| 2007/0136453 | A1 | 6/2007 | Ewing et al. |
| 2007/0140238 | A1 | 6/2007 | Ewing et al. |

OTHER PUBLICATIONS

"PC 5585: Voltage Selectable for 120V~ or 240V~, 1Ø, 50/60 Hz Up to 30A," Pulizzi Engineering Inc., 3 pp. (1999).

"Complaint for Patent Infringement," Server Technology, Inc. v. American Power Conversion Corporation, Case No. 3:06-CV-, 58 pp. (Dec. 18, 2006).

"First Amended Complaint for Patent Infringement," Server Technology, Inc. v. American Power Conversion Corporation, Case No. 3:06-CV-00698-LRH-VPC, 83 pp. (Feb. 20, 2007).

"Defendant's Answer and Affirmative Defenses to Plaintiff's Complaint for Patent Infringement; Counterclaims for Declaratory Judgment of Patent Noninfringement and Patent Invalidity; and Patent Infringement," Case No. 3:06-CV-00698-LRH-(VPC), 37 pp. (Apr. 2, 2007).

"Defendant's First Amended Answer and Affirmative Defenses to Plaintiff's Complaint for Patent Infringement; Counterclaims for Declaratory Judgment of Patent Noninfringement and Patent Invalidity; and Patent Infringement," Case No. 3:06-CV-00698-LRH-(VPC), 36 pp. (Apr. 13, 2007).

"Plaintiff Server Technology Inc.'s Reply to Defendant's First Amended Counterclaims for Declaratory Judgment of Patent Noninfringement and Patent Invalidity; and Patent Infringement," Case No. 3:06-CV-00698-LRH-VPC, 8 pp. (Apr. 30, 2007).

"Server Technology's Proposed Order on Claim Construction," Server Technology, Inc. v. American Power Conversion Corporation, Case No. 3:06-CV-00698-LRH-VPC, 22 pp. (Dec. 05, 2008).

"American Power Conversion Corp.'s Proposed Order on Claim Construction," Server Technology, Inc. v. American Power Conversion Corporation, Case No. 3:06-CV-00698-LRH-VPC, 24 pp. (Dec. 05, 2008).

"Continuation of Server Technology's Reply to American Power Conversion Corp.'s Response to Opening Claim Construction Brief," Server Technology, Inc. v. American Power Conversion Corporation, Case No. 3:06-CV-00698-LRH-VPC, 94 pp. (Aug. 11, 2008).

Systems Enhancement Corporation, "Power Administrator 800 User Manual," Oct. 1, 1996, Systems Enhancement Corporation, Chesterfield, MO, USA.

American Power Conversion Corporation, "MasterSwitch VM Power Distribution Unit User Guide," Dec. 1999, American Power Conversion Corporation, W. Kingston, RI, USA.

American Power Conversion Corporation, "MasterSwitch VM Power Distribution Unit Installation and Quick Start Manual," Dec. 1999, American Power Conversion Corporation, W. Kingston, RI, USA.

American Power Conversion Corporation, "PowerNet SNMP Management Information Base v3.1.0 Reference Guide," Nov. 1999, American Power Conversion Corporation, W. Kingston, RI, USA.

"Server Technology, Inc.'s Fifth Amended Disclosure of Asserted Claims and Preliminary Infringement Contentions With Exhibits," Server Technology, Inc. v. American Power Conversion Corporation, Case No. 3:06-CV-00698-LRH-VPC, 30 pp. (Sep. 29, 2007).

"American Power Conversion Corporation's Preliminary Invalidity Contentions," Server Technology, Inc. v. American Power Conversion Corporation, Case No. 3:06-CV-00698-LRH-VPC, 89 pp. (Oct. 12, 2007).

"American Power Conversion Corporation's Preliminary Claim Constructions and Extrinsic Evidence (Patent Local Rule 4-2)," Server Technology, Inc. v. American Power Conversion Corporation, Case No. 3:06-CV-00698-LRH-VPC, 8 pp. (Jan. 21, 2008).

Plaintiff and Counterdefendent Server Technology, Inc.'s Preliminary Claim Constructions and Extrinsic Evidence (Patent Local Rule 4-2), Server Technology, Inc. v. American Power Conversion Corporation, Case No. 3:06-CV-00698-LRH-VPC, 7 pp. (Jan. 29, 2008).

"Joint Claim Construction Chart and Prehearing Statement (Patent Rule 4.3)," Server Technology, Inc. v. American Power Conversion Corporation, Case No. 3:06-CV-00698-LRH-VPC, 77 pp. (Feb. 22, 2008).

"Plaintiff and Counterdefendent Server Technology, Inc.'s Opening Claim Construction Brief," Server Technology, Inc. v. American Power Conversion Corporation, Case No. 3:06-CV-00698-LRH-VPC, 206 pp. (May 19, 2008).

"American Power Conversion Corp.'s Response to Plaintiff and Counterdefendant Server Technology, Inc.'s Opening Claim Construction Brief," Server Technology, Inc. v. American Power Conversion Corporation, Case No. 3:06-CV-00698-LRH-VPC, 279 pp. (Jul. 25, 2008).

"Plaintiff and Counterdefendant Server Technology, Inc.'s Reply to APC's Response to STI's Opening Claim Construction Brief," Server Technology, Inc. v. American Power Conversion Corporation, Case No. 3:06-CV-00698-LRH-VPC, 287 pp. (Aug. 8, 2008).

"American Power Conversion Corporation's Response to Server Technology's Proposed Order on Claim Construction," Server Technology, Inc. v. American Power Conversion Corporation, Case No. 3:06-CV-00698-LRH-VPC, 24 pp. (Jan. 5, 2009).

"Server Technology's Corrected Response in Opposition to APC's Proposed Order on Claim Construction," Server Technology, Inc. v. American Power Conversion Corporation, Case No. 3:06-CV-00698-LRH-VPC, 23 pp. (Jan. 8, 2009).

"American Power Conversion Corporation's Reply Regarding Server Tech.'s Proposed Order on Claim Construction," *Server Technology, Inc.* v. *American Power Conversion Corporation*, Case No. 3:06-CV-00698-LRH-VPC, 13 pp. (Jan. 12, 2009).

"Server Technology's Reply to APC's Response to Server Technology's Proposed Order on Claim Construction," *Server Technology, Inc.* v. *American Power Conversion Corporation*, Case No. 3:06-CV-00698-LRH-VPC, 13 pp. (Jan. 12, 2009).

"American Power Conversion Corporation's Motion for Leave to File a Surreply to Server Tech.'s Reply Brief on Claim Construction," *Server Technology, Inc.* v. *American Power Conversion Corporation*, Case No. 3:06-CV-00698-LRH-VPC, 3 pp. (Jan. 22, 2009).

"Server Technology's Response in Opposition to APC's Motion to File a Surreply to Server Technology's Reply Brief on Claim Construction," *Server Technology, Inc.* v. *American Power Conversion Corporation*, Case No. 3:06-CV-00698-LRH-VPC, 9 pp. (Feb. 7, 2009).

"Server Technology's Response in Opposition to APC's Proposed Order on Claim Construction," *Server Technology, Inc.* v. *American Power Conversion Corporation*, Case No. 3:06-CV-00698-LRH-VPC, 23 pp. (Jan. 6, 2009).

"American Power Conversion Corporation's Surreply to Server Tech.'s Reply Brief on Claim Construction," *Server Technology, Inc.* v. *American Power Conversion Corporation*, Case No. 3:06-CV-00698-LRH-VPC, 5 pp. (Jan. 22, 2009).

ELECTRICAL POWER DISTRIBUTION DEVICE HAVING A CURRENT DISPLAY

RELATED APPLICATIONS AND PATENTS

This application is a continuation of U.S. patent application Ser. No. 11/243,701, filed Oct. 4, 2005, and titled VERTICAL-MOUNT ELECTRICAL POWER DISTRIBUTION PLUGSTRIP, which is a continuation of U.S. patent application Ser. No. 09/930,780, filed Aug. 15, 2001, issued as U.S. Pat. No. 7,043,543 on May 9, 2006, and titled VERTICAL-MOUNT ELECTRICAL POWER DISTRIBUTION PLUGSTRIP, which is a continuation-in-part of U.S. patent application Ser. No. 09/732,557, filed Dec. 8, 2000, issued as U.S. Pat. No. 7,099,934 on Aug. 29, 2006, and titled NETWORK-CONNECTED POWER MANAGER FOR REBOOTING REMOTE COMPUTER-BASED APPLIANCES, which is a continuation-in-part of U.S. patent application Ser. No. 09/375,471, filed Aug. 16, 1999, issued as U.S. Pat. No. 6,711,613 on Mar. 23, 2004, and titled REMOTE POWER CONTROL SYSTEM THAT VERIFIES WHICH DEVICES IS SHUT-DOWN BEFORE SUCH ACTION IS COMMITTED TO, which is a continuation-in-part of U.S. patent application Ser. No. 08/685,436, filed on Jul. 23, 1996, issued as U.S. Pat. No. 5,949,974 on Sep. 7, 1999, and titled SYSTEM FOR READING THE STATUS AND CONTROLLING THE POWER SUPPLIES OF APPLIANCES CONNECTED TO COMPUTER NETWORKS, all of which are hereby incorporated herein by reference.

BACKGROUND

1. Technical Field

The technical field relates generally to power management systems and, more particularly, to electrical power distribution devices and methods.

2. Description of the Prior Art

Network server "farms" and other network router equipment have settled on the use of equipment bays in 19" standard RETMA racks. Many of these server and router farms are located at telephone company (TelCo) central equipment offices because they need to tie into very high bandwidth telephone line trunks and backbones. So each TelCo typically rents space on their premises to the network providers, and such space is tight and very expensive.

The typical network router, server, or other appliance comes in a rack-mount chassis with a standard width and depth. Such chassis are vertically sized in whole multiples of vertical units (U). Each rented space in the TelCo premises has only so much vertical space, and so the best solution is to make best use of the vertical space by filling it with the network appliances and other mission-critical equipment.

Two kinds of operating power are supplied to such network appliances, alternating current (AC) from an uninterruptible power supply (UPS) or direct from a utility, the second kind is direct current (DC) from TelCo central office battery sets. Prior art devices have been marketed that control such AC or DC power to these network appliances. For example, Server Technology, Inc. (Reno, Nev.) provides operating-power control equipment that is specialized for use in such TelCo premises RETMA racks. Some of these power-control devices can cycle the operating power on and off to individual network appliances.

Such cycling of operating power will force a power-on reset of the network appliance, and is sometimes needed when an appliance hangs or bombs. Since the network appliance is usually located remote from the network administration center, Server Technology has been quite successful in marketing power managers that can remotely report and control network-appliance operating power over the Internet and other computer data networks.

Conventional power management equipment has either been mounted in the tops or bottoms of the server farm RETMA racks, and thus has consumed vertical mounting space needed by the network appliances themselves. So what is needed now is an alternate way of supplying AC or DC operating power to such network appliances without having to consume much or any RETMA rack space.

SUMMARY

Briefly, an electrical power distribution plugstrip embodiment of the present invention comprises a long, thin plugstrip body with several power outlet plugs distributed along the length of one face. A power input cord can be provided at one end, and this can supply operating power to each of the power outlet plugs through individual relay control.

An advantage of certain embodiments of the present invention is that an electrical power distribution plugstrip is provided that frees up rackmount space for other equipment.

Another advantage of certain embodiments of the present invention is that an electrical power distribution plugstrip is provided for controlling the operating power supplied to network appliances.

A further advantage of certain embodiments of the present invention is that an electrical power distribution plugstrip is provided that allows a network console operator to control the electrical power status of a router or other network device.

A still further advantage of certain embodiments of the present invention is that an electrical power distribution plugstrip is provided for reducing the need for enterprise network operators to dispatch third party maintenance vendors to remote equipment rooms and POP locations simply to power-cycle failed network appliances.

There are other objects and advantages of various embodiments of the present invention. They will no doubt become obvious to those of ordinary skill in the art after having read the following detailed description of the preferred embodiments which are illustrated in the various drawing figures.

IN THE DRAWINGS

DETAILED DESCRIPTION OF THE PREFERRED EMBODIMENTS

Figure 1:
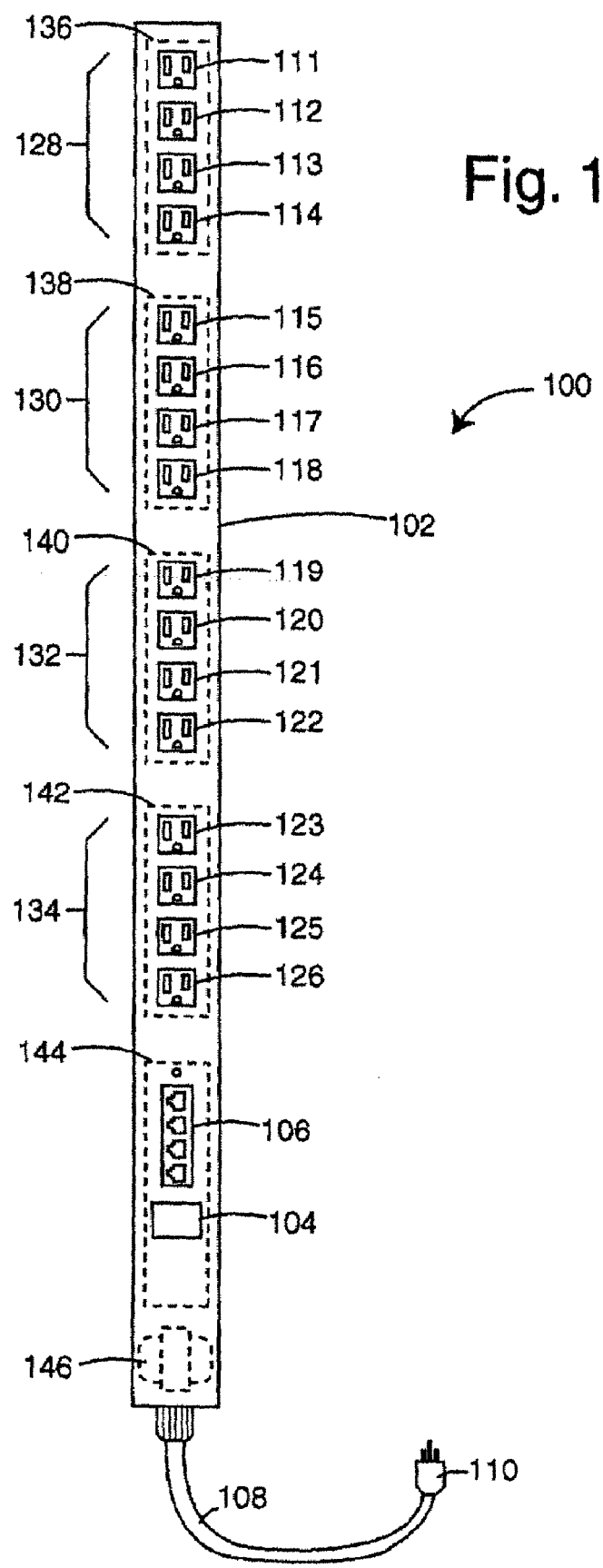
FIG. 1 is a functional block diagram of an electrical power distribution plugstrip embodiment of the present invention.

FIG. 1 represents an electrical power distribution plugstrip embodiment of the present invention, and is referred to herein by the general reference numeral 100. The electrical power distribution plugstrip 100 includes a long, thin housing 102 with one face having a user display 104 and a set of RJ-11 control jacks 106. A power input cord 108 is provided at one end and has an appropriate power plug 110. For example, the power plug 110 is rated for 125 VAC at 30 A. A plurality of power outlet sockets 111-126 are provided along a single face of the housing 102. The user display 104 preferably provides a digital readout of the total input current flowing in on power input cord 108.

The total input current display 104 can be used to advantage by a technician when installing or troubleshooting a RETMA equipment rack by watching how much current change is observed when each network appliance is plugged in and turned on. Unusually high or low currents can indicate particular kinds of faults to experienced technicians.

In alternative embodiments of the present invention, each power outlet socket 111-126 is provided with a current-sensing device that can measure the individual load current. Such measurement can then be reported locally on the user display 104, or serially communicated out to a remote location. Which power outlet socket 111-126 to measure can be user selected by a simple pushbutton associated with each. Other more complex selection mechanisms can also be employed.

A first group of power outlet sockets 111-114 are mounted on a first intelligent power module (IPM) 128. A second group of power outlet sockets 115-118 are mounted on a second IPM 130. A third group of power outlet sockets 119-122 are mounted on a third IPM 132. And a fourth group of power outlet sockets 123-126 are mounted on a fourth IPM 134. The user display 104 and RJ-11 control jacks 106 are mounted on a power distribution and user display printed circuit board (PCB) 144. A power transformer 146 is used to step-down electrical power to the logic power supply levels needed by the IPM's 128-134, and PCB 144.

The manufacturing and marketing of IPM's 128-134 can be greatly enhanced by making the hardware and software implementation of each IPM the same as the others. When a system that includes these IPM's is operating, it preferably sorts out for itself how many IPM's are connected in a group and how to organize their mutual handling of control and status data in and out.

Figure 2:
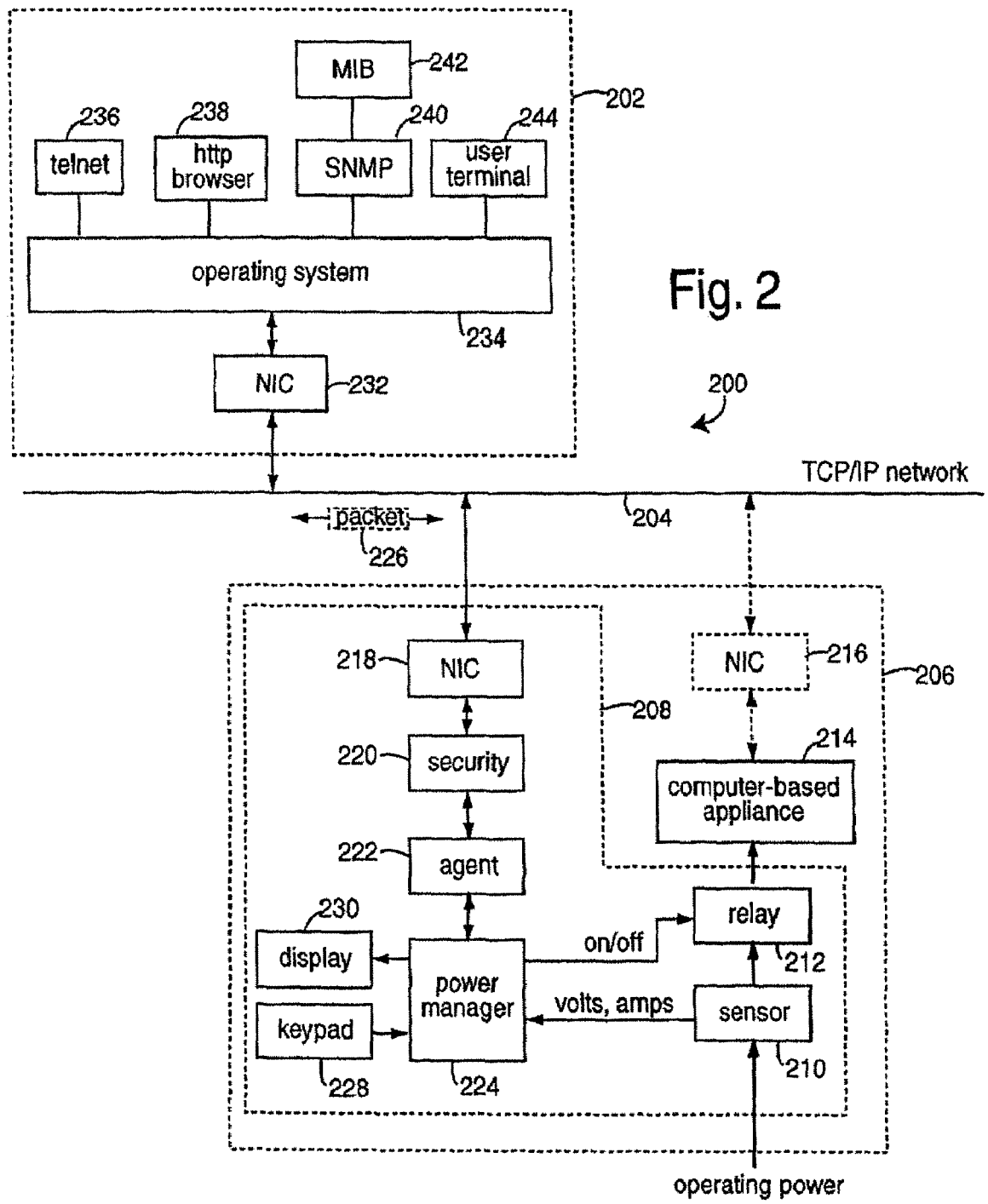
FIG. 2 is a functional block diagram of a power manager system embodiment of the present invention that incorporates the electrical power distribution plugstrip of FIG. 1 in a TCP/IP network environment.

FIG. 2 represents a power manager system embodiment of the present invention, and is referred to herein by the general reference numeral 200. The electrical power distribution plugstrip 100 (FIG. 1) is incorporated here, but is shown controlling only one relay and the operating power to one network appliance. Preferred embodiments of the present invention control many such relays and their corresponding network appliances.

A network management system (NMS) 202 is connected by a network 204 to a remote site 206. A power controller 208 forwards operating power through a sensor 210 and relay-switch 212 to a computer-based appliance 214. As many of the functional parts of power controller 208 as possible are packaged in preferred embodiments of the present invention in a package like that of the electrical power distribution plugstrip 100 (FIG. 1). Preliminary implementations have packaged the network interface components in another chassis, e.g., one that rack-mounts in a 19" RETMA equipment rack at remote site 206.

The operating power being controlled by relay 212 can be the traditional 110 VAC or 220 VAC power familiar to consumers, or direct current (DC) battery power familiar to telephone central-office "plant" employees. A network interface controller (NIC) 216 may be used to connect the computer-based appliance 214 to the network 204. Such would be especially true if the computer-based appliance 214 were a server, router, bridge, etc.

The power controller 208 can be configured to operate in a number of different modes, and such options are selected and stored in a configuration memory. The NMS 202 may download configurations to power controller 208, and may upload them for editing, archiving, and/or duplication to other power controllers 208 at other remote sites 206. Embodiments of the present invention are directed towards systems and methods that do such uploading, downloading, editing, archiving, and duplication of power manager configuration files.

The power manager system 200 maintains the operating health of the computer-based appliance 214. Such computer-based appliance 214 is prone to freezing or crashing where it is effectively dead and unresponsive. It is also some mission-critical assignment that suffers during such down time. It is therefore the role and purpose of the power manager 200 to monitor the power and environmental operating conditions in which the computer-based appliance 214 operates, and to afford management personnel the ability to turn the computer-based appliance 214 on and off. Such allows a power-on rebooting of software in the computer-based appliance 214 to be forced remotely from the NMS 202. The operating conditions and environment are preferably reported to the NMS 202 on request and when alarms occur.

The power controller 208 further includes a network interface controller (NIC) 218, and this may be connected to a security device 220. If the network 204 is the Internet, or otherwise insecure, it is important to provide protection of a network agent 222 from accidental and/or malicious attacks that could disrupt the operation or control of the computer-based appliance 214. At a minimum, the security device 220 can be a user password mechanism. Better than that, it could include a discrete network firewall and data encryption.

The network agent 222 interfaces to a remote power manager 224, and it converts software commands communicated in the form of TCP/IP datapackets 226 into signals the remote power manager can use. For example, messages can be sent from the NMS 202 that will cause the remote power manager 224 to operate the relay-switch 212. In reverse, voltage, current, and temperature readings collected by the sensor 210 are collected by the remote power manager 224 and encoded by the network agent 222 into appropriate datapackets 226. Locally, a keyboard 228 can be used to select a variety of readouts on a display 230, and also to control the relay-switch 212.

The display 230 and keyboard 228 can be connected as a terminal through a serial connection to the power manager 224. Such serial connection can have a set of intervening modems that allow the terminal to be remotely located. The display 230 and keyboard 228 can also be virtual, in the sense that they are both emulated by a Telnet connection over the network 204.

The NMS 202 typically comprises a network interface controller (NIC) 232 connected to a computer platform and its operating system 234. Such operating system can include Microsoft WINDOWS-NT, or any other similar commercial product. Such preferably supports or includes a Telnet application 236, a network browser 238, and/or an SNMP application 240 with an appropriate MIB 242. A terminal emulation program or user terminal 244 is provided so a user can manage the system 200 from a single console.

If the computer-based appliance 214 is a conventional piece of network equipment, e.g., as supplied by Cisco Systems (San Jose, Calif.), there will usually be a great deal of pre-existing SNMP management software already installed, e.g., in NMS 202 and especially in the form of SNMP 240. In such case it is usually preferable to communicate with the network agent 222 using SNMP protocols and procedures. Alternatively, the Telnet application 236 can be used to control the remote site 206.

An ordinary browser application 238 can be implemented with MSN Explorer, Microsoft Internet Explorer, or Netscape NAVIGATOR or COMMUNICATOR. The network agent 222 preferably includes the ability to send http-messages to the NMS 202 in datapackets 226. In essence, the network agent 222 would include an embedded website that exists at the IP-address of the remote site 206. An exemplary embodiment of a similar technology is represented by the MASTER-SWITCH-PLUS marketed by American Power Conversion (West Kingston, R.I.).

Many commercial network devices provide a contact or logic-level input port that can be usurped for the "tickle" signal. Cisco Systems routers, for example, provide an input that can be supported in software to issue the necessary message and identifier to the system administrator. A device interrupt has been described here because it demands immediate system attention, but a polled input port could also be used.

Network information is generally exchanged with protocol data unit (PDU) messages, which are objects that contain variables and have both titles and values. SNMP uses five types of PDUs to monitor a network. Two deal with reading terminal data, two deal with setting terminal data, and one, the trap, is used for monitoring network events such as terminal start-ups or shut-downs. When a user wants to see if a terminal is attached to the network, for example, SNMP is used to send out a read PDU to that terminal. If the terminal is attached, a user receives back a PDU with a value "yes, the terminal is attached". If the terminal was shut off, a user would receive a packet informing them of the shutdown with a trap PDU.

In alternative embodiments of the present invention, it may be advantageous to include the power manager and intelligent power module functions internally as intrinsic components of an uninterruptable power supply (UPS). In applications where it is too late to incorporate such functionally, external plug-in assemblies are preferred such that off-the-shelf UPS systems can be used.

Once a user has installed and configured the power controller 208, a serial communications connection is established. For example, with a terminal or terminal emulation program. Commercial embodiments of the present invention that have been constructed use a variety of communications access methods.

For modem access, the communication software is launched that supports ANSI or VT100 terminal emulation to dial the phone number of the external modem attached to the power manager. When the modems connect, a user should see a "CONNECT" message. A user then presses the enter key to send a carriage return.

For direct RS-232C access, a user preferably starts any serial communication software that supports ANSI or VT100 terminal emulation. The program configures a serial port to one of the supported data rates (38400, 29200, 9600, 4800, 2400, 2200, and 300 BPS), along with no parity, eight data bits, and one stop bit, and must assert its Device Ready signal (DTR or DSR). A user then presses the enter key to send a carriage return.

For Ethernet network connections, the user typically connects to a power controller 208 by using a TELNET program or TCP/IP interface. The power manager will automatically detect the data rate of the carriage return and send a username login prompt back to a user, starting a session. After the carriage return, a user will receive a banner that consists of the word "power manager" followed by the current power manager version string and a blank line and then a "Username:" prompt.

A user logged in with the administrative username can control power and make configuration changes. A user logged in with a general username can control power. Also, while a user logged in with the administrative username can control power to all intelligent power modules, a user logged in with a general username may be restricted to controlling power to a specific intelligent power module or set of intelligent power modules, as configured by the administrator.

A parent case, U.S. patent application Ser. No. 09/732,557, filed Aug. 22, 2000, titled NETWORK-CONNECTED POWER MANAGER FOR REBOOTING REMOTE COMPUTER-BASED APPLIANCES, includes many details on the connection and command structure used for configuration management of power manager embodiments of the present invention. Such patent application is incorporated herein by reference and the reader will find many useful implementation details there. Such then need not be repeated here.

Referring again to FIG. 2, a user at the user terminal 244 is able to send a command to the power manager 224 to have the power manager configuration file uploaded. The power manager 224 concentrates the configuration data it is currently operating with into a file. The user at user terminal 244 is also able to send a command to the power manager 224 to have it accept a power manager configuration file download. The download file then follows. Once downloaded, the power manager 224 begins operating with that configuration if there were no transfer or format errors detected. These commands to upload and download configuration files are preferably implemented as an extension to an already existing repertoire of commands, and behind some preexisting password protection mechanism. HyperTerminal, and other terminal emulation programs allow users to send and receive files.

In a minimal implementation, the power manager configuration files are not directly editable because they are in a concentrated format. It would, however be possible to implement specialized disassemblers, editors, and assemblers to manipulate these files off-line.

Figure 3:
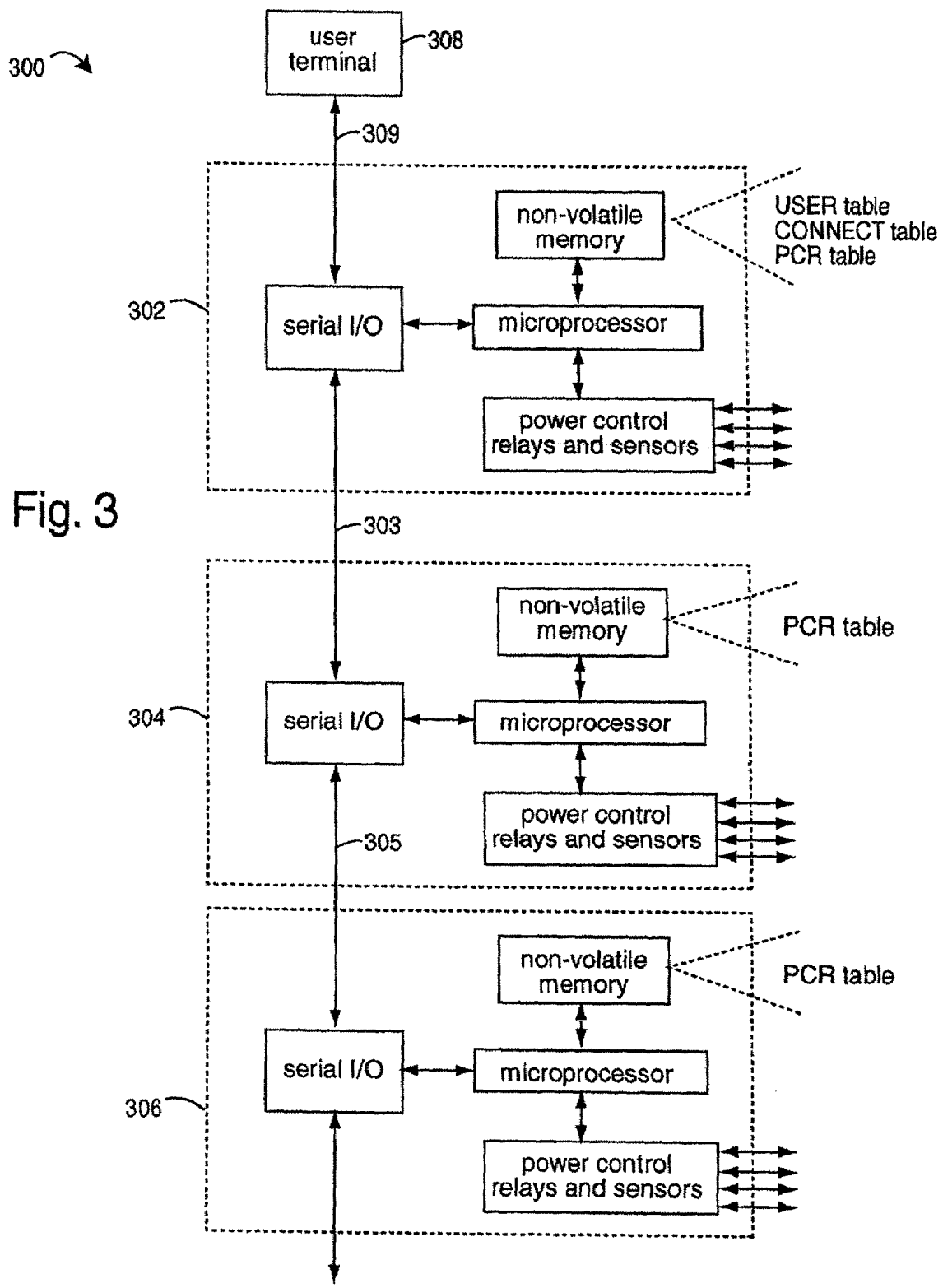
FIG. 3 is a functional block diagram of four intelligent power modules in a serial-communication daisy-chain all in a power manager system embodiment of the present invention that is one embodiment of the electrical power distribution plugstrip of FIG. 1.

FIG. 3 is a diagram of an expandable power management system 300 that can be implemented in the style of the plug-strip 100 (FIG. 1). In one commercial embodiment of the present invention, a first power controller board 302 is daisy-chain connected through a serial cable 303 to a second power controller board 304. In turn, the second power controller board 304 is connected through a serial cable 305 to a third power controller board 306. All three power controller boards can communicate with a user terminal 308 connected by a cable 309, but such communication must pass through the top power controller board 302 first.

Alternatively, the user terminal can be replaced by an IP-address interface that will provide a webpresence and interactive webpages. If then connected to the Internet, ordinary browsers can be used to upload and download user configurations.

Each power controller board is preferably identical in its hardware and software construction, and yet the one placed at the top of the serial daisy-chain is able to detect that situation and take on a unique role as gateway. Each power controller board is similar to power controller 208 (FIG. 2). Each power controller board communicates with the others to coordinate actions. Each power controller board independently stores user configuration data for each of its power control ports. A typical implementation will have four relay-operated power control ports. Part of the user configuration can include a user-assigned name for each control port.

A resynchronization program is executed in each microprocessor of each power controller board 302, 304, and 306, that detects where in the order of the daisy-chain that the particular power controller board is preferably located. The appropriate main program control loop is selected from a collection of firmware programs that are copied to every power controller board. In such way, power controller boards may be freely added, replaced, or removed, and the resulting group will resynchronize itself with whatever is present.

The top power controller board 302 uniquely handles interactive user log-in, user-name tables, its private port names, and transfer acknowledgements from the other power controller boards. All the other power controller boards concern themselves only with their private resources, e.g., port names.

During a user configuration file upload, power controller board 302 begins a complete message for all the power controller boards in the string with the user-table. Such is followed by the first outlets configuration block from power controller board 302, and the other outlet configuration blocks from power controller boards 304 and 306. The power controller board 302 tells each when to chime in. Each block carries a checksum so transmission errors can be detected. Each block begins with a header that identifies the source or destination, then the data, then the checksum.

During a user configuration file download, power controller board 302 receives a command from a user that says a configuration file is next. The user-name table and the serial-name table is received by power controller board 302 along with its private outlets configuration block and checksum. The next section is steered to power controller board 304 and it receives its outlets configuration block and checksum. If good, an acknowledgement is sent to the top power controller board 302. The power controller boards further down the string do the same until the whole download has been received. If all power controller boards returned an acknowledgement, the power controller board 302 acknowledges the whole download. Operation then commences with the configuration. Otherwise a fault is generated and the old configuration is retained.

Figure 4A:
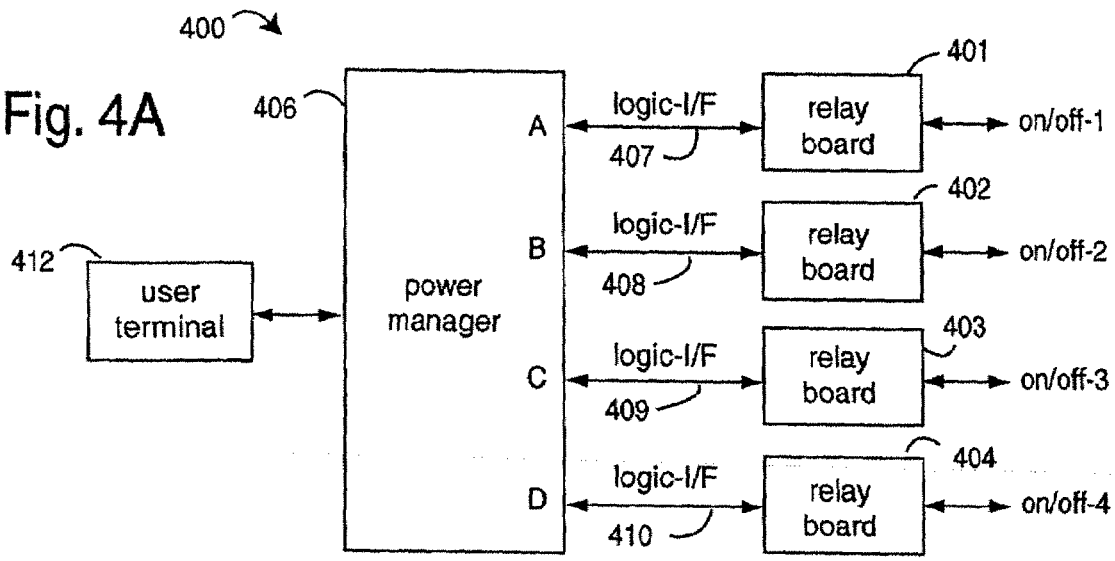
FIG. 4A is a functional block diagram of an intelligent power module embodiment of the present invention that is one embodiment of the electrical power distribution plugstrip of FIG. 1.
Figure 4B:
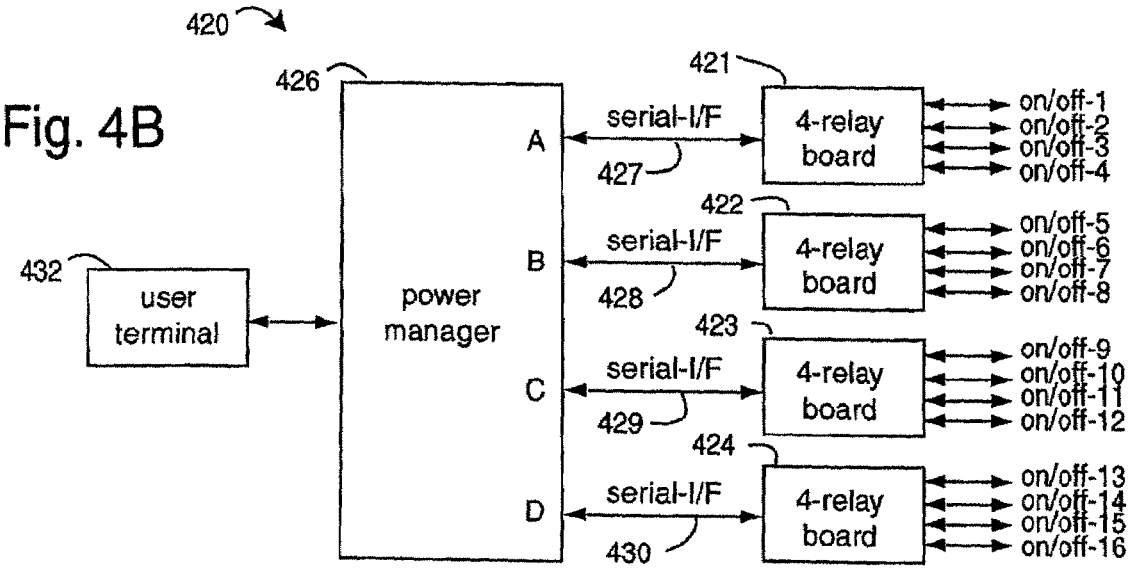
FIG. 4B is a functional block diagram of another intelligent power module embodiment of the present invention in which a single power manager is able to simultaneously control four 4-relay boards.

FIGS. 4A and 4B are power control systems that can be implemented in the style of the plugstrip 100 (FIG. 1). FIG. 4A represents a basic power control system 400 that includes four single-point relay boards 401-404 that are able to independently control the operating power flowing to various pieces of network equipment and other appliances. Each relay board 401-404 is separately connected to a power manager 406, e.g., with a three-wire cable 407-410 and RJ-11 type plugs and jacks. A user can control the system 400 from a user terminal 412.

FIG. 4B represents an expanded power control system 420 that includes four four-point relay boards 421-424. This array is able to independently control the operating power flowing to sixteen pieces of network equipment and other appliances. Each relay board 421-424 is separately connected via a serial RS-232 communications link to a power manager 426, e.g., with a three-wire cable 427-430 and RJ-11 type plugs and jacks. A user can control the system 420 from a user terminal 432. Preferably, the power managers 406 and 426 differ only in their programming, and not in their constituent hardware. Logic level relay boards require only two-wires (control signal and common), but serial relay boards require three wires (data send, data receive, and common). Even logic level boards use three wires, with the third wire being used for the relay board to report power output status (on or off) back to the power controller circuit board.

Each relay board 421-424 includes a PIC-microcontroller, e.g., a Microchip Technology (Chandler, Ariz.) PIC16F84A device, that controls the serial communication interface with the power manager 426. Serial data is interpreted by the microcontroller and is used to independently operate each of the relay board's several onboard relays. Such serial communication and therefore the microcontroller isn't necessary for the relay boards 401-404 (FIG. 4A).

In a preferred application, the expanded power control system 420 is used instead of daisy-chain connecting power managers to get more control points. For example, power controller boards 304 and 306 (FIG. 3) could be eliminated and still as many as sixteen control points can be accommodated. The configuration in FIG. 3 would otherwise accommodate twelve control points as shown.

Figure 5:
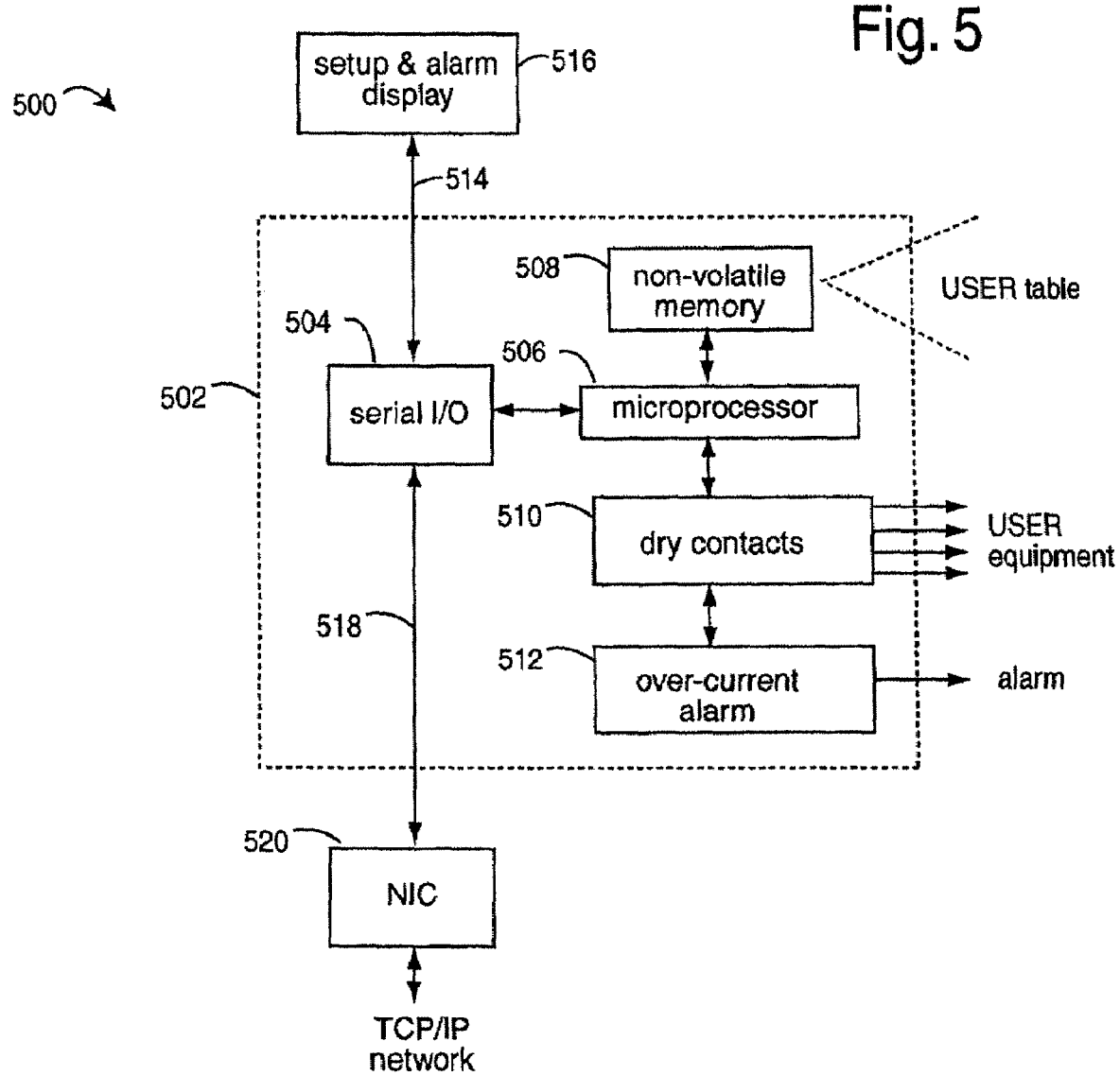
FIG. 5 is a functional block diagram of a single intelligent power module that controls several loads with dry-contact relays and can issue an alarm to alert a user when too much current is being demanded by one load, or all of the loads together.

FIG. 5 is a single intelligent power module (IPM) 500 for controlling several loads with dry-contact relays. It provides for an alarm to alert when too much current is being demanded by one or all of the loads together. A serial input/output interface 504 is connected to a microprocessor 506 with a non-volatile program memory 508. A set of dry contacts 510 are generated from serial data. An over-current alarm 512 can issue an external alarm and/or report such condition over the serial communication channel 514 to a user display 516 or over a network interface controller (NIC) 520.

Figure 6:
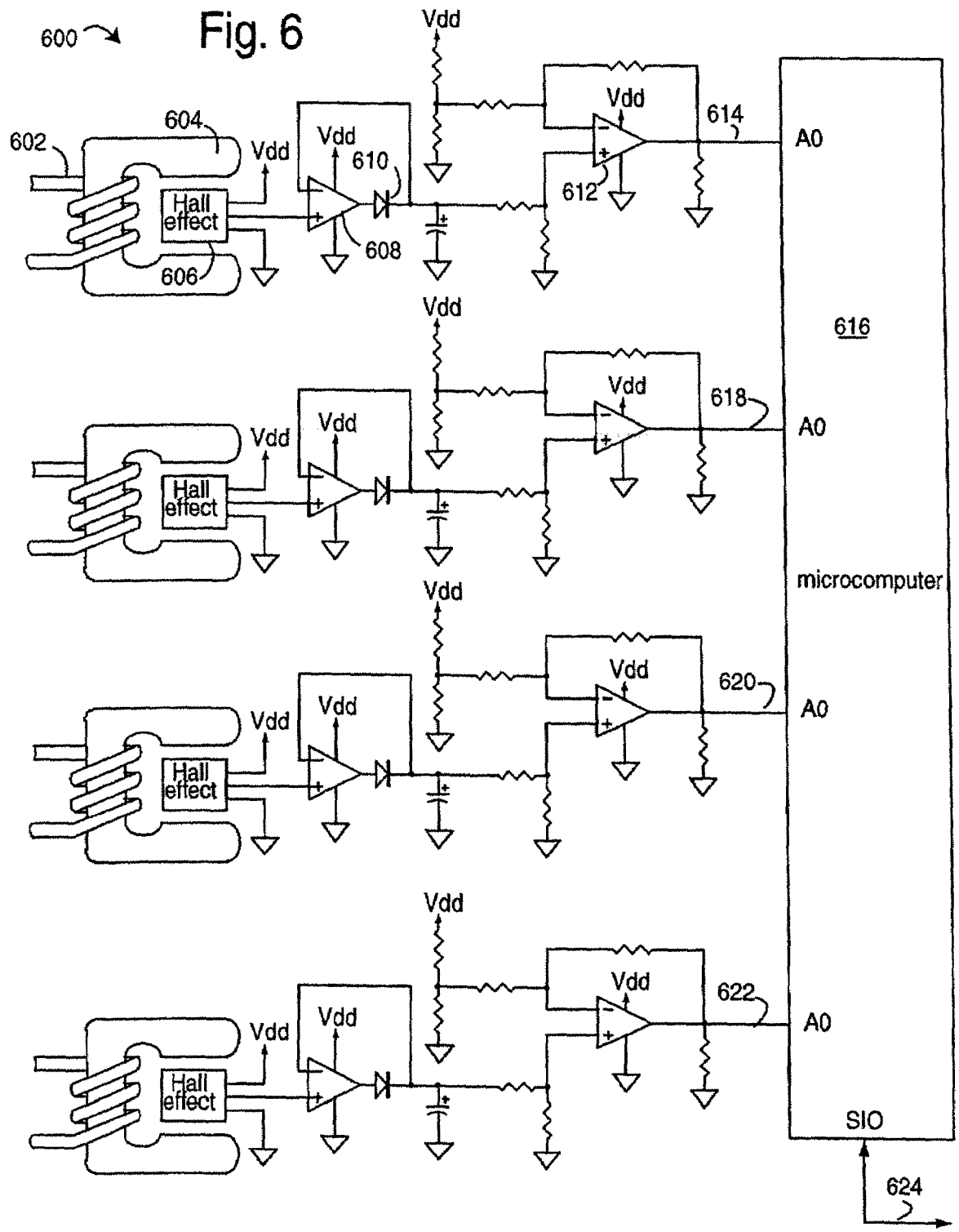
FIG. 6 is a schematic diagram of an addition to a four-port power module that can be used to monitor and report the load current being delivered through each power outlet socket.

FIG. 6 represents a four-port current monitor 600, which can be used in addition to a four-port power module. The current monitor 600 is used to measure and report the load current being delivered through each power outlet socket. In one embodiment, one of the power mains wires 602 for a power outlet socket is wrapped around a torroid 604 with an air gap. A Hall-effect sensor 606 is disposed in the air gap and can measure the magnetic field generated. Such magnetic field will vary in strength proportional to the current passing through the power mains wires. A commercial device that has delivered good results is manufactured by Allegro Microsystems, Inc. (Worcester, Mass.), and is marketed as model A3515LUA. See: "www.allegromicro.com". An excellent reference that describes how to use such Hall-effect devices in current-measurement applications is, Allegro Technical Paper STP 98-1, "Non-Intrusive Hall-Effect Current-Sensing Techniques Provide Safe, Reliable Detection and Protection for Power Electronics", by Paul Emerald, circa 2001. Also see, Allegro Data Sheet 27501.10B, "3515 and 3516 Ratiometric, Linear Hall-Effect Sensors for High-Temperature Operation".

Current monitor 600 further comprises an operational amplifier (op-amp) 608 that is combined with a signal diode 610 to precision rectify the AC signal obtained from Hall-effect device 606. The rectified signal is filtered and amplified by an op-amp 612. An output signal 614 is a DC voltage linear with the AC current flowing in the corresponding power mains outlet.

The output of op-amp 612 is input to an analog-to-digital converter (ADC) built into a microcomputer 616. Three other such current sensing circuits are included, and each respectively produce signals 618, 620, and 622. The microcomputer 616 communicates its four current measurements over a serial input/output (SIO) channel 624. These may be reported to a network operations center via TCP/IP on the Internet, or locally for a user display. Over-current alarms and thresholds are preferably programmed in software in the executing programs included in microcomputer 616. Such alarms, when issued, can also be reported to the network operations center via TCP/IP, or locally.

Essentially, no calibration is needed. The output of the Hall-effect sensor 606 is typically about 5.0 millivolts per Gauss. With two turns on the torroid 604, the air gap will fill with 13.8 Gauss per amp of power-main outlet current. Therefore, for a current of 14.142 amps peak-to-peak, 10.0 amps RMS, the Hall-effect sensor 606 can be expected to output a sinusoidal signal of about 0.9758 volts p-p.

If the ADC conversion is 8-bits with an analog input voltage range of 0-5, each binary bit represents 19.53 millivolts. The input range for a tested ADC was thirty amps, about 8-counts per amp. Keeping with this scaling, the output of the current sensing circuitry at ten amps RMS is 1.56 volts.

In general, embodiments of the present invention provide power-on sequencing of its complement of power-outlet sockets so that power loading is brought on gradually and not all at once. For example, power comes up on the power outlet sockets 2-4 seconds apart. An exaggerated power-up in-rush could otherwise trip alarms and circuit breakers. Embodiments display or otherwise report the total current being delivered to all loads, and some embodiments monitor individual power outlet sockets. Further embodiments of the present invention provide individual remote power control of independent power outlet sockets, e.g., for network operations center reboot of a crashed network server in the field.

The power-on sequencing of the power-outlet sockets preferably allows users to design the embodiments to be loaded at 80% of full capacity, versus 60% of full capacity for prior art units with no sequencing. In some situations, the number of power drops required in a Data Center can thus be reduced with substantial savings in monthly costs.

Figure 7:
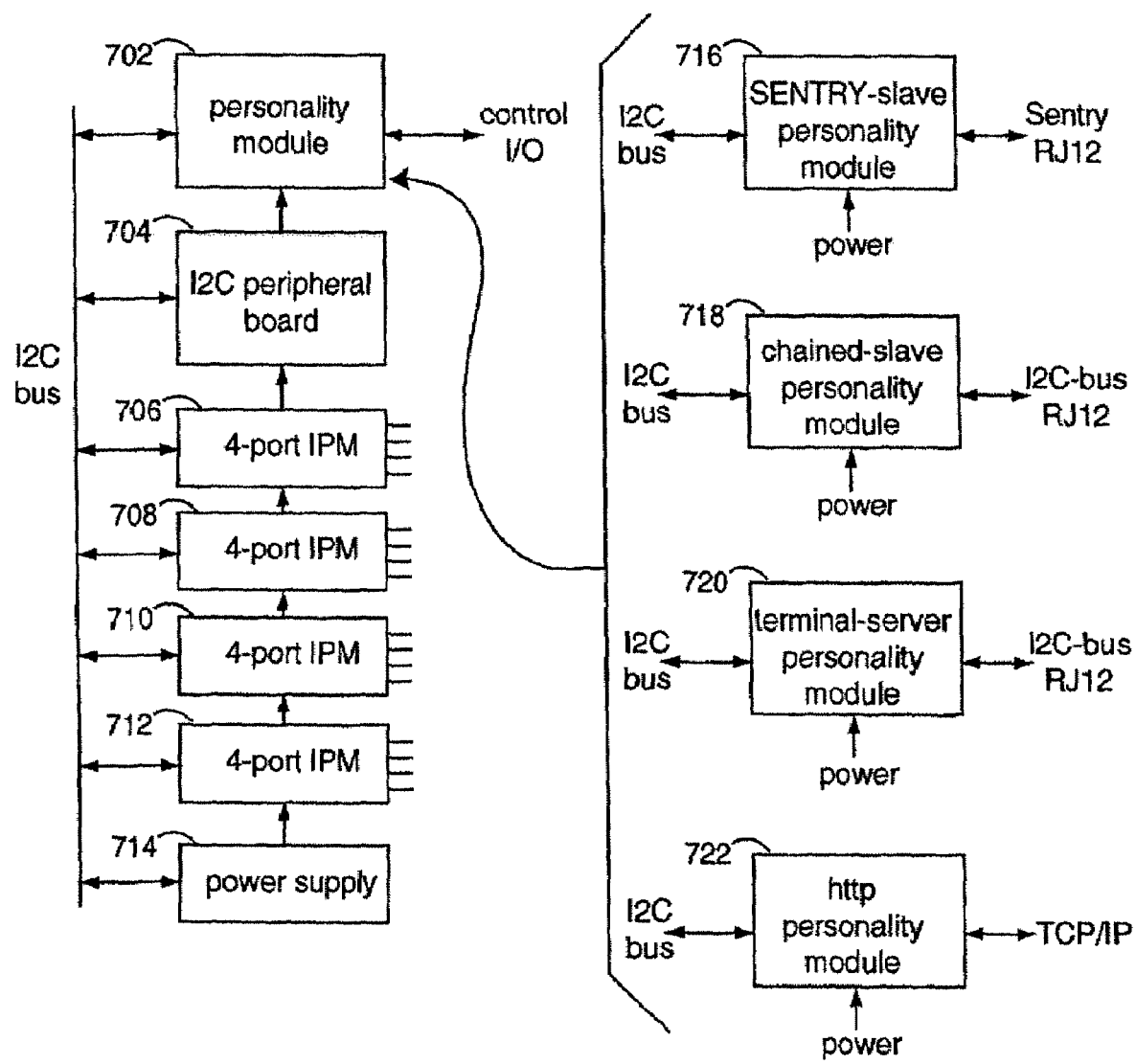
FIG. 7 is a functional block diagram of a power distribution unit embodiment of the present invention that allows a variety of personality modules to be installed for various kinds of control input/output communication.

FIG. 7 represents a power distribution unit (PDU) embodiment of the present invention, and is referred to herein by the general reference numeral 700. The PDU 700 allows a personality module 702 to be installed for various kinds of control input/output communication. A Philips Semiconductor type P89C644 microcontroller is preferably included in the personality module 702.

The PDU 700 further comprises an I2C peripheral board 704, and a set of four IPM's 706, 708, 710, and 712. Such provide sixteen power outlets altogether. A power supply 714 provides +5-volt logic operating power, and a microcontroller with a serial connection to an inter-IC control (I2C) bus 717. Such I2C bus 717 preferably conforms to industry standards published by Philips Semiconductor (The Netherlands). See, www.semiconductor.philips.com. Philips Semiconductor type microcontrollers are preferably used throughout PDU 700 because of the included interfaces Philips microcontrollers have for the I2C bus.

A SENTRY-slave personality module 716 can be substituted for personality module 702 and typically includes a Server Technology, Inc. (Reno, Nev.) SENTRY-type interface and functionality through a standard RJ12 jack. See, www.servertech.com. A chained-slave personality module 718 can be substituted for personality module 702 and provides a daisy-chain I2C interface and functionality through a standard RJ12 jack. A terminal-server personality module 720 can be substituted for personality module 702 and provides a display terminal interface, e.g., via I2C through a standard RJ12 jack, or RS-232 serial on a DIN connector. An http personality module 722 can be substituted for personality module 702 and provides a hypertext transfer protocol (http) browser interface, e.g., via 100 BASE-T network interface and a CAT-5 connector. The on-board microcontroller provides all these basic personalities through changes in its programming, e.g., stored in EEPROM or Flash memory devices.

All of PDU 700 is preferably fully integrated within power distribution plugstrip 100, in FIG. 1.

Figure 8:
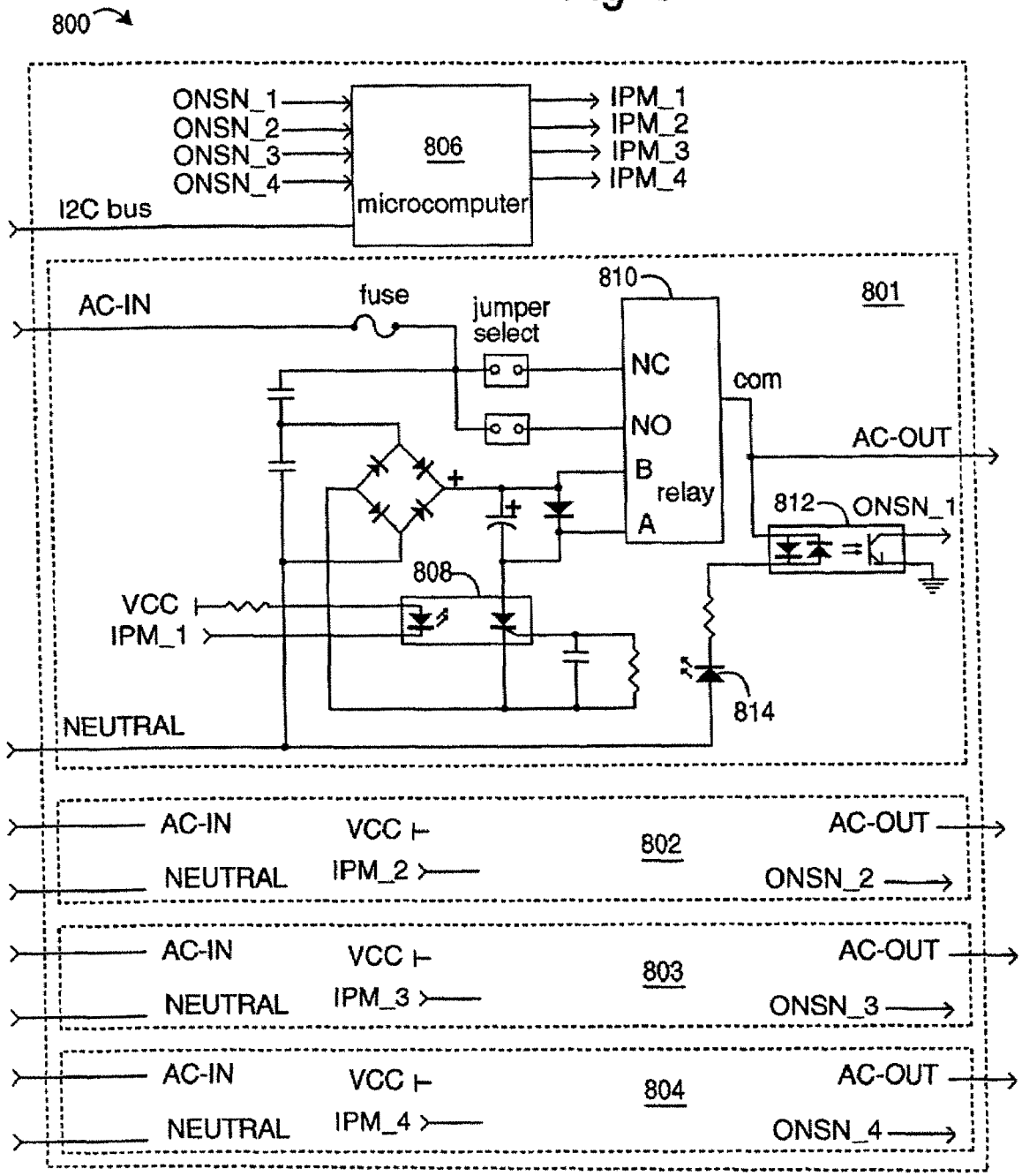
FIG. 8 is a functional block diagram of a 4-port intelligent power module embodiment of the present invention like those shown in FIG. 7.

FIG. 8 represents a 4-port intelligent power module (IPM) embodiment of the present invention, and is referred to herein by the general reference numeral 800. IPM 800 is like the four IPM's 706, 708, 710, and 712, shown in FIG. 7. The IPM 800 includes a set of four power control channels 801-804, and a microcontroller 806. The Philips 87LPC762 microcontroller has provided good results in this application. Each power control channel 801-804 includes an input control opto-isolator 808, a single-pole, double throw (SPDT) relay 810, and an output opto-isolator 812. A ground (logic low) on IPM_1 will cause relay 810 to pull in. The normally closed (NC) contacts will open, and the normally open (NO) contacts will close. The AC input hot (AC-IN) will be passed through to the AC output (AC-OUT) according to a jumper selection for NO or NC operation. If the power is on at AC-OUT, the output opto-isolator 812 acts as on on-sense (ONSN) detector to provide an open-collector logic signal for a microcontroller status input. The microcontroller 806 sends and receives serial data over the I2C bus, and provides the IPM_1, IPM_2, IPM_3, and IPM_4, control signals for all four power control channels. The microcontroller 806 can also report the on-off status of any of the four power control channels 801-804.

The on-sense circuitry of FIG. 8 is such that more than just the power switch being switched on has to occur, there must be power actually flowing to the relay output to the AC-OUT terminal.

Although the present invention has been described in terms of the present embodiment, it is to be understood that the disclosure is not to be interpreted as limiting. Various alterations and modifications will no doubt become apparent to those skilled in the art after having read the above disclosure. Accordingly, it is intended that the appended claims be interpreted as covering all alterations and modifications as fall within the true spirit and scope of the invention.

What is claimed is:

1. An electrical power distribution device connectable to one or more electrical loads in an electrical equipment rack, the electrical power distribution device comprising in combination:

A. an electrical power distribution device enclosure;

B. a power input penetrating the electrical power distribution device enclosure;

C. a plurality of power outputs disposed along the electrical power distribution device enclosure, each among the plurality of power outputs being connectable to a corresponding one of said one or more electrical loads;

D. a plurality of power control relays disposed in the electrical power distribution device enclosure, each among said plurality of power control relays being connected to said power input and in independent power controlling communication with one or more corresponding power outputs among said plurality of power outputs;

E. a current-related information display disposed on the electrical power distribution device enclosure in current-related information determining communication with at least one among said power input and said plurality of power outputs; and F. a current-related information reporting system associated with the electrical power distribution device enclosure and being (i) in current-related information determining communication with at least one among said power input and said plurality of power outputs, and (ii) connectable in current-related information transfer communication with a separate communications network distal from the electrical power distribution device.

2. The electrical power distribution device of claim 1 further comprising at least one intelligent power section disposed in the electrical power distribution device enclosure and in which is disposed at least one of the plurality of power control relays.

3. The electrical power distribution device of claim 2 further comprising an external power manager application external to the electrical power distribution device enclosure connectable in network communication with the intelligent power section disposed in the electrical power distribution device enclosure, whereby a user of the external power manager may control power provided to selectable ones of said plurality of power outputs.

4. The electrical power distribution device of claim 1 further comprising a plurality of intelligent power sections disposed in the electrical power distribution device enclosure, each said intelligent power section being in independent communication with at least a corresponding one or more among the plurality of power outputs.

5. The electrical power distribution device of claim 4 further comprising an external power manager application external to the electrical power distribution device enclosure and connectable in network communication with the plurality of intelligent power sections disposed in the electrical power distribution device enclosure, whereby a user of the external power manager may control power provided to selectable ones of said plurality of power outputs.

6. The electrical power distribution device of claim 1 wherein the current-related information display is in current determining communication with all among the plurality of power outputs through at least one current sensing device.

7. The electrical power distribution device of claim 1 wherein the current-related information display is in current determining communication with all among the plurality of power outputs through at least one current sensing device.

8. The electrical power distribution device of claim 5 wherein the current-related information display is in current determining communication with all among the plurality of power outputs through at least one current sensing device.

9. The electrical power distribution device of claim 2 wherein said intelligent power section comprises an intelligent power module having at least one of the plurality of power control relays and the corresponding power output for such one power control relay.

10. The electrical power distribution device of claim 3 wherein said intelligent power section comprises an intelligent power module having at least one of the plurality of power control relays and the corresponding power output for such one power control relay.

11. The electrical power distribution device of claim 4 wherein each said intelligent power section comprises an intelligent power module having at least one of the plurality of power control relays and the corresponding one or more power outputs for such one power control relay.

12. The electrical power distribution device of claim 5 wherein each said intelligent power section comprises an intelligent power module having at least one of the plurality of power control relays and the corresponding one or more power outputs for such one power control relay.

13. The electrical power distribution device of claim 7 wherein each said intelligent power section comprises an intelligent power module having at least one of the plurality of power control relays and the corresponding one or more power outputs for such one power control relay.

14. The electrical power distribution device of claim 8 wherein each said intelligent power section comprises an intelligent power module having at least one of the plurality of power control relays and the corresponding one or more power outputs for such one power control relay.

15. An electrical power distribution device connectable to one or more electrical loads in an electrical equipment rack, the electrical power distribution device comprising in combination:

A. an enclosure having a length that is longer than a width of the enclosure;

B. a power input penetrating the enclosure;

C. a plurality of power outputs disposed along an area on a face of said length of the enclosure, each among the plurality of power outputs being removably connectable to a corresponding one of said one or more electrical loads;

D. a plurality of power control relays disposed in the enclosure, each among said plurality of power control relays being connected to said power input and to one or more corresponding power outputs among said plurality of power outputs;

E. a digital current information display disposed on another area of the enclosure in current determining communication with at least one among said power input and said plurality of power outputs; and F. a current information reporting system (i) associated with the enclosure (ii) in power information determining communication with at least one among said power input and said plurality of power outputs, and (iii) communicatingly connectable with a distal current information reporting system through a communications network external to the electrical power distribution device.

16. The electrical power distribution device of claim 15 further comprising at least one intelligent power section disposed in the enclosure and in which is disposed at least one of the plurality of power control relays.

17. The electrical power distribution device of claim 16 further comprising an external power manager application external to the enclosure connectable in network communication with the intelligent power section disposed in the enclosure, whereby a user of the external power manager may control power provided to selectable ones of said plurality of power outputs.

18. The electrical power distribution device of claim 15 further comprising a plurality of intelligent power sections disposed in the enclosure, each said intelligent power section being in independent communication with at least a corresponding one or more among the plurality of power outputs.

19. The electrical power distribution device of claim 18 further comprising an external power manager application external to the enclosure and connectable through said communications network with the plurality of intelligent power sections disposed in the enclosure, whereby a user of the external power manager may control power provided to selectable ones of said plurality of power outputs.

20. The electrical power distribution device of claim 16 wherein said intelligent power section comprises an intelligent power module having at least one of the plurality of power control relays and the corresponding power output for such one power control relay.

21. The electrical power distribution device of claim 17 wherein said intelligent power section comprises an intelligent power module having at least one of the plurality of power control relays and the corresponding power output for such one power control relay.

22. The electrical power distribution device of claim 18 wherein each said intelligent power section comprises an intelligent power module having at least one of the plurality of power control relays and the corresponding one or more power outputs for such one power control relay.

23. The electrical power distribution device of claim 19 wherein each said intelligent power section comprises an intelligent power module having at least one of the plurality of power control relays and the corresponding one or more power outputs for such one power control relay.

* * * * *